United States Patent [19]
Hussmann et al.

[11] Patent Number: 5,418,685
[45] Date of Patent: May 23, 1995

[54] HOUSING FOR A CONTROL DEVICE HAVING A PRINTED CIRCUIT BOARD WITH AN ELECTRICALLY AND THERMALLY CONDUCTING LINING

[75] Inventors: Dieter Hussmann, Steinheim; Thomas Jessberger, Eberdingen; Dieter Karr, Tiefen bronn; Karl Schupp, Pforzheim; Peter Jares, Sindelfingen; Dieter Neuhaus, Sulzbach; Markus Harsch, Asperg; Bernd Weber, Abstatt, all of Germany

[73] Assignee: Robert Bosch GmbH, Stuttgart, Germany

[21] Appl. No.: 133,178

[22] Filed: Oct. 14, 1993

[30] Foreign Application Priority Data

Feb. 21, 1992 [DE] Germany .................. 42 05 388.9
Jul. 21, 1992 [DE] Germany .................. 42 24 008.5

[51] Int. Cl.6 ............................................. H05K 7/20
[52] U.S. Cl. ............................. 361/719; 174/35 GC; 361/818
[58] Field of Search ............... 174/35 R, 35 GC, 51, 174/252; 165/80.3, 185; 257/708-710, 712, 713, 723, 724; 361/704, 705, 707, 712, 717-719, 720, 736, 752, 753, 816, 818

[56] References Cited

U.S. PATENT DOCUMENTS

| | | | |
|---|---|---|---|
| 4,599,680 | 7/1986 | Gibson | 361/386 |
| 4,658,334 | 4/1987 | McSparran | 361/415 |
| 4,831,498 | 5/1989 | Baba | 361/424 |
| 4,956,746 | 9/1990 | Gates, Jr. | 361/385 |
| 5,014,160 | 5/1991 | McCoy, Jr. | 361/818 |
| 5,045,971 | 9/1991 | Ono | 361/386 |
| 5,107,404 | 4/1992 | Tam | 361/818 |
| 5,239,126 | 8/1993 | Oshiba | 361/818 |

FOREIGN PATENT DOCUMENTS

3128856 10/1983 Germany .
4023319 12/1991 Germany .
2239739 10/1991 United Kingdom .

*Primary Examiner*—Gerald P. Tolin
*Attorney, Agent, or Firm*—Michael J. Striker

[57] ABSTRACT

In order to provide protection against disruptive radiation and achieve good conduction of heat, a housing for control devices which has multiple parts is provided with a printed circuit board carrying power components and control elements with a peripherally extending lining of electrically and thermally conducting material. The printed circuit board is clamped between the housing halves in the region of the linings. The power components are contacted by the lining so as to be thermally conducting, while control elements which give off intensive disruptive radiation or are sensitive to such radiation are enclosed within connecting pieces projecting from the walls of the housing parts.

28 Claims, 5 Drawing Sheets

HOUSING FOR A CONTROL DEVICE HAVING A PRINTED CIRCUIT BOARD WITH AN ELECTRICALLY AND THERMALLY CONDUCTING LINING

BACKGROUND OF THE INVENTION

The present invention relates to a housing for control devices.

More particularly, it relates to a housing which has a plurality of housing parts connected with one another, and a carrier member arranged inside the housing and carrying electrical power components and control elements connected by at least one plug element secured in the housing.

On the one hand, such control devices should be stable and provide secure support for the electrical components as well as protect them from destructive influences. On the other hand, an electronic circuit which is accommodated in such housings should be protected against disruptive external electrical radiation. By the same token, disruptive radiation originating in the electrical circuit should be prevented just as effectively from exiting outward. Further, components which are sensitive to disruptive radiation should also be protected from components emitting disruptive radiation. Finally, the heat generated in the components in the electric circuit should be reliably carried off so as to prevent damage to the components or impaired operation.

SUMMARY OF THE INVENTION

Accordingly, it is an object of the present invention to provide a housing for control devices, which avoids the disadvantages of the prior art.

In keeping with these objects and with others which will become apparent hereinafter, one feature of the present invention resides, briefly stated, in a housing for control devices in which the carrier element is formed as a printed circuit board which is clamped by at least one portion of its outer region between portions of the housing parts, particularly between the base part and the cover part, and has a lining of electrically conducting and thermally conducting material at the clamping location and at an adjoining region, and the power components are connected with the lining so as to be thermally conductive.

When the housing is designed in accordance with the present invention, it has the advantage that the heat generated by the power components is guided off in a simple and reliable manner and the housing parts are electrically and thermally connected with one another so as to be prevented from releasing radiation and protected from external radiation.

In particular, the housing parts can be connected so as to be electrically and thermally conducting in a very economical manner and so as to facilitate assembly in that they are lined on both sides.

The lining can be arranged in a recess of the printed circuit board, with a depth corresponding to the height of the lining. The lining can be rolled also on the inside of the recess as a copper layer. The connection parts can be guided through bore holes in the printed circuit board. The lining can include the bore holes and make contacts from one side to the other through the bore holes. The lining can made of copper. It can cover the edges of the printed board peripherally.

A thermally conducting connection between the heat sources of the electrical circuit is advantageously produced when the power components have cooling vanes by which they are connected particularly soldered with the printed circuit board.

In a further improvement the housing can have cross piece projecting from the circumferential wall which is situated vertically with reference to the dividing plane between the housing parts and continue in the opposite part and end in the plane of the end face of the housing parts, where the printed circuit board is clamped between the cross pieces. On the other hand the cross pieces can project from the outer wall of the housing parts between the housing parts, continue in the opposite housing part and end in the plane of the end face of the housing parts, where the printed circuit board is clamped between the cross pieces. The lining can extend along a part of the end face of the cross pieces. In this construction, cross pieces provided mechanical stability and an improved stability of the housing parts against vibrations on the one hand and a more secure clamping of the printed circuit board and enlargement of the thermally conducting and electrically conducting connection between the housing parts on the other hand. When the power components are accommodated in the housing having housing parts with a flange region projecting inwards and being at least partially peripheral to form cross pieces with niches enclosing the electrical components, power components generating high heat are thermally separated from other types of components and heat is carried off in an improved manner also by radiating heat to the wall parts enclosing the power components. At the same time, the convection of the heat generated by the power components can be spatially limited in that the printed circuit board is divided up into parcels.

In a particularly advantageous manner when the flange is formed by inwardly bent parts of the housing wall while other parts of the housing wall form an outer flange region so that the printed circuit board is clamped between the outer flange region and the other housing part, the rigidity of the housing is increased while at the same time providing shielding within the housing against electrical interference. Finally, the cross pieces can have recesses provided at their end faces contacting the printed circuit board for conductor paths so that, the connecting pieces are joined so as to be electrically and thermally conducting and so as to form a shielded interior housing part. In a particularly advantageous manner, the components to be protected from disruptive radiation or to be prevented from releasing disruptive radiation are arranged within the region enclosed by the connecting pieces.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENT

Figure 1:
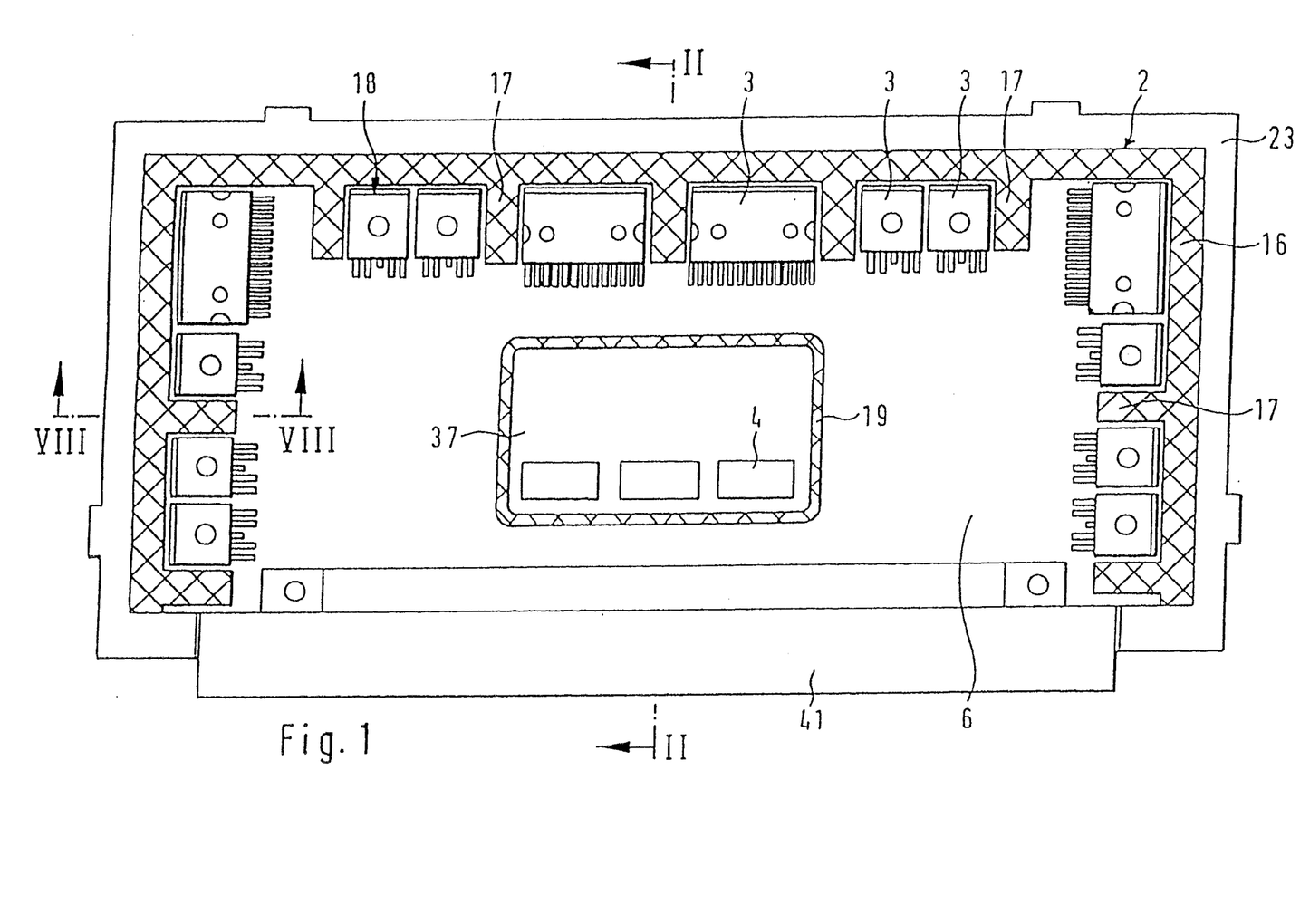
FIG. 1 shows a section parallel to the parting plane or dividing plane of the housing parts of a first embodiment example of a housing for control devices.
Figure 2:
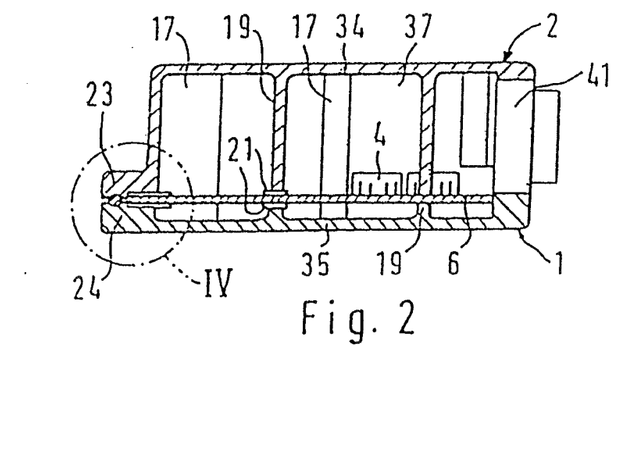
FIG. 2 shows a section along line II—II in FIG. 1 through the housing for control devices.

FIG. 1 shows a section through the cover 2 of a housing for control devices. The hatched area represents the sectional area through the wall of the cover. A flange 23, which is shown in a side view in the following FIG. 3, can be seen in FIG. 1 around the outer periphery of the sectional area. Cross pieces 17 project from the peripheral wall 16, shown in section, into the interior of the housing and, together with the peripheral wall 16, from niches 18 in which electrical power components 3 are arranged. These electrical power components 3 are located on a printed circuit board 6 which is clamped between the cover 2 and a base 1 in the dividing plane between the cover and the base. The printed circuit board projects into the region of the flange 23 of the cover and of a correspondingly identically dimensioned flange 24 of the base as can be seen in FIGS. 2 and 4. One of the flanges 23 or 24 can have a projection 26 which extends around the outer periphery and grasps the printed circuit board along the periphery so as to hold it in a preferred position. A seal 27, e.g. a toroidal sealing ring, is inserted between this peripheral projection and the flange of the other housing part in corresponding guide recesses 28 in the flanges. After the printed circuit board 6 is placed on the end face 29 of the flange 24 and after the seal 27 is inserted, the housing parts are connected by placing the cover on by the end face 30 of its flange and subsequently clamping or screwing in a conventional manner.

Figure 7:
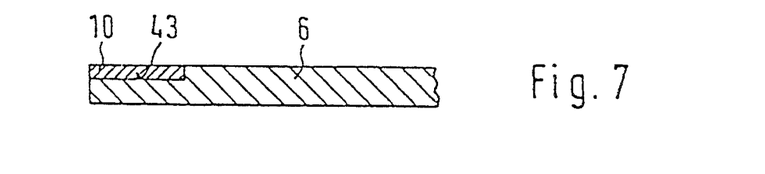
FIG. 7 shows a second embodiment example of the invention with a lining inserted in the printed circuit board.

The printed circuit board is constructed in a conventional manner with conductor paths, not shown in more detail, for electrically connecting the individual components. In addition, it has a lining 10 which is preferably located at both sides in the edge region of the printed circuit board and in particular extends as far as the outermost edge in such a way that the end faces 30 and 29 of the cover and base, respectively, contact the lining 10 so as to be electrically and thermally conductive when the two halves of the housing are assembled. The lining 10 either has the same layer height as that of the conductor paths or can be inserted into a recess 43 in the printed circuit board 6, as shown in FIG. 7, so as to be flush with the surface of the printed circuit board in spite of having a greater thickness than that of conventional conductor paths. Thus, another advantageous possibility is provided for arranging so-called SMD components (Surface-Mounted Devices) on the printed circuit board. The lining may be advantageously made of copper and laminated on, rolled on or deposited by electroplating. The heat conducting characteristics are improved by the greater thickness of the lining. By assembling the two halves of the housing, i.e. the cover and base, the housing is accordingly sealed so as to be impervious to electrical radiation with respect to the seam between these parts and penetration of disruptive radiation is prevented. In addition, this provides a thermally conducting connection from the interior of the housing to the housing wall.

Cooling vanes 14 of the power components make contact with the aforementioned lining 10 so as to conduct heat. These cooling vanes which are commercially produced in series are held in contact with the lining so as to conduct heat in a reliable manner either by screwing or soldering or by fastening in some other manner. The lining extends far enough into the interior of the housing so as to ensure a reliable transfer of heat with the components. In particular, the lining also extends into the region of the projecting cross pieces 17, between whose opposite end faces the printed circuit board with the lining is clamped. The lining of the printed circuit board is provided on both sides and these sides are connected with one another so to be electrically and thermally conducting to achieve an improved conductivity and particularly to provide an electrical connection between the two housing parts. Connection parts 12 are provided for this purpose. These connection parts 12 are guided through bore holes in the printed circuit board 6 and connected with the lining. The connection parts 12 can be produced with the lining in one work step when the printed circuit board is pre-drilled or bore holes can be made and then sealed so as to be electrically conductive. It is also possible to connect the two sides of the lining at the ends, which renders the arrangement particularly impervious to radiation.

Figure 8:
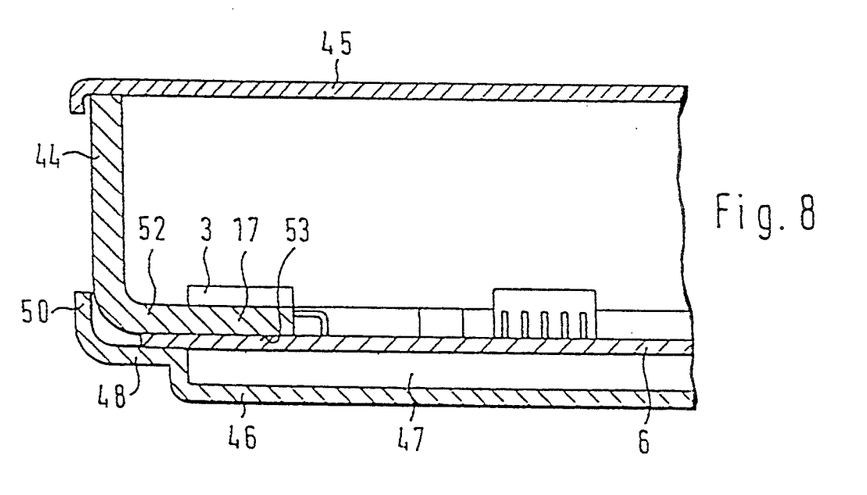
FIG. 8 shows a third embodiment example of the invention with a housing including three parts, one of which projects over the circumference of the printed circuit board.

A third embodiment example of the invention according to FIG. 8 shows an embodiment form in which it is possible to shield the printed circuit board at the end sides. For this purpose the cover 2 shown in FIGS. 1 to 6 is constructed in two parts from a peripheral frame 44 and a cover part 45 of sheet metal which is beaded or flanged at the edge toward the frame 44. The frame 44 is also formed from sheet metal as is the base 46 corresponding to the base 1 in FIGS. 1 to 6. This base has a base trough 47 which is defined along the periphery by a flange 48, the printed circuit board 6 being clamped between the flange 48 and the frame 44. Further, the flange 48 has a raised edge 50 which engages the end side of the printed circuit board 6 along the periphery and also overlaps a portion of the frame 44. This edge provides improved protection against disruptive radiation which is given off or against the penetration of disruptive radiation from the outside.

The frame 44 which is formed from sheet metal has a flange region 52 on the side of the printed circuit board 6 which projects inward vertically from the peripheral wall and, together with its surface 53 facing the printed circuit board, forms the end face of the frame by which the frame contacts the printed circuit board 6. The lining extends over the entire flange region. FIG. 8 shows a section along line VIII—VIII in FIG. 1, from which it can be seen that this section is drawn through one of the cross pieces 17. Thus, the flange region 52 also has these cross pieces 17, although they are not as high as those in the embodiment example according to FIGS. 1 to 6. As in the preceding embodiment example, the cross pieces 17 enclose the electrical components, in particular power components which generate high heat, and form niches 18 as is also shown in FIG. 1. Accordingly, a good conduction of heat toward the housing surface is also ensured in this case. The frame 44 can be constructed as a bent metal plate in an advantageous manner. But it could also be produced as a cast part.

Figure 9:
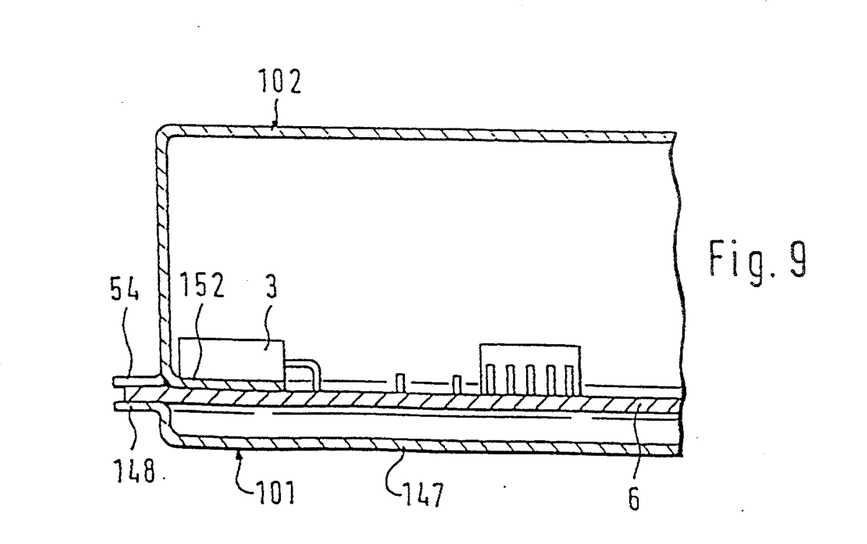
FIG. 9 shows a variant of the housing with a housing wall which is partly bent inward and partly bent outward so as to form a flange.

FIG. 9 shows another construction variant of the housing, once again with a housing having two parts, a cover 102 and base 101. These parts are formed from sheet metal. The base is again constructed as a base trough 147 as in the embodiment example according to FIG. 8 and has an outer flange 148 which extends peripherally but is interrupted, if necessary, by connections. Similarly as in FIG. 8, the cover 102 is provided with a flange region 152. Parts of the edge of the pot-shaped cover 102 are bent inward in the manner of a flange to form a flange region 152 as in FIG. 8, while other parts of the edge are bent outward in the manner of a flange to form an outer flange 54, the printed circuit board being securely clamped between the outer flange 54 and the peripheral outer flange 148 of the base 104. The lining extends to the outer flange 50 and the flange region 152 and, of course, also to the outer peripheral flange 148 of the base 101. The flange region 152 again forms niches similar to the construction according to FIG. 8, the electrical components 3 being set into these niches.

Due to the arrangement of the power components in niches 18 and their heat-conducting connection with the lining 10, the heat generated in the power components is immediately transmitted directly to the housing, from which the heat can radiate outward. Further, by accommodating the power components 3 in the niches 18, the transfer of radiated heat and convection heat to the neighboring housing wall parts is better than it would be in a different arrangement of the components on the printed circuit board. In this way, the power components are cooled in an optimal manner.

Figure 5:
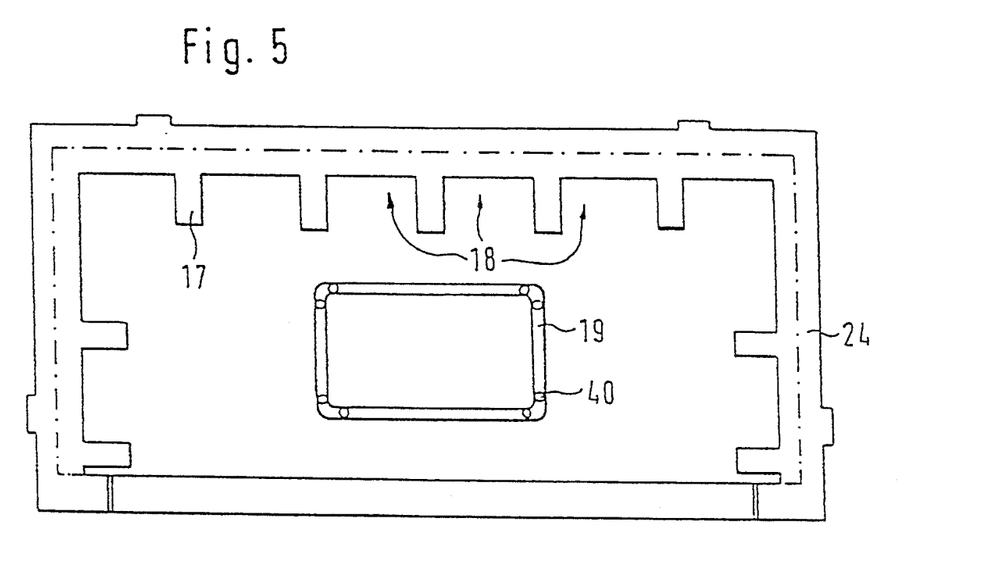
FIG. 5 shows a top view of the end face of one half of the housing in the plane dividing the two halves of the housing.
Figure 6:
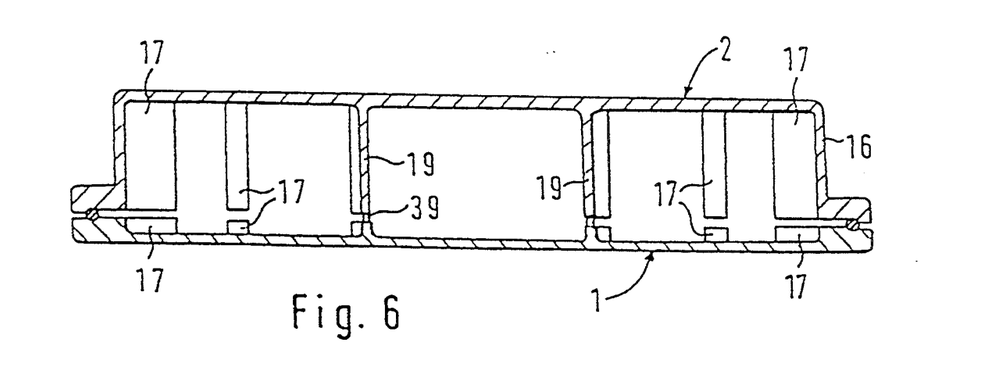
FIG. 6 shows a section through the assembled housing halves of the housing according to the invention without printed circuit board.

Since a circuit of a control device also contains, in addition to power components, other control elements 4 which must be protected from disruptive electromagnetic radiation or which themselves give off electromagnetic radiation which would interfere with other components, the housing according to the invention is further designed in such a way that one or more connecting pieces 19 project inward vertically from the housing wall 34 adjoining the peripheral wall and extend vertically to the dividing plane 33 of the housing parts so as to be flush with the end face 30. These connecting pieces 19 at one housing part are located opposite corresponding connecting pieces which project from the wall 35 of the other housing part so as to be flush with these connecting pieces 19. The printed circuit board 6 is clamped between the end faces of these connecting pieces 19 as can be seen in FIG. 2. In the region of the end face of the connecting pieces, the printed circuit board is again provided with a through-contacted lining 21 so that the connecting pieces are connected with one another at this location so as to be electrically conducting. The connecting pieces accordingly enclose between one another, or between one another and the printed circuit board, a region 37 which is sealed against disruptive radiation and protect control elements 4 which are located in this region 37 against disruptive radiation and protect elements located outside this region from disruptive radiation proceeding from the components located within this region 37. The contact is advantageously made from copper which has good electrically conducting properties as well as good thermally conducting properties. The through-contact of the contact 21 between the connecting pieces can also be effected in that small pins 39 project from the end face of the connecting pieces on one side as can be seen in FIG. 6. These pins 39 project through a corresponding bore hole through the printed circuit board and the contact in the assembled state of the housing parts and make electrical contact in that they engage in a corresponding bore hole in the end face of the connecting piece on the other side. For the sake of clarity, the printed circuit board is omitted in FIG. 6 which shows a section through the assembled housing parts. FIG. 5 shows a view of the end face 29 of the base 1 of the housing facing the other half of the housing. The bore holes 40 in which the pins 39 engage can be seen in the region of the connecting piece 19.

Figure 10:
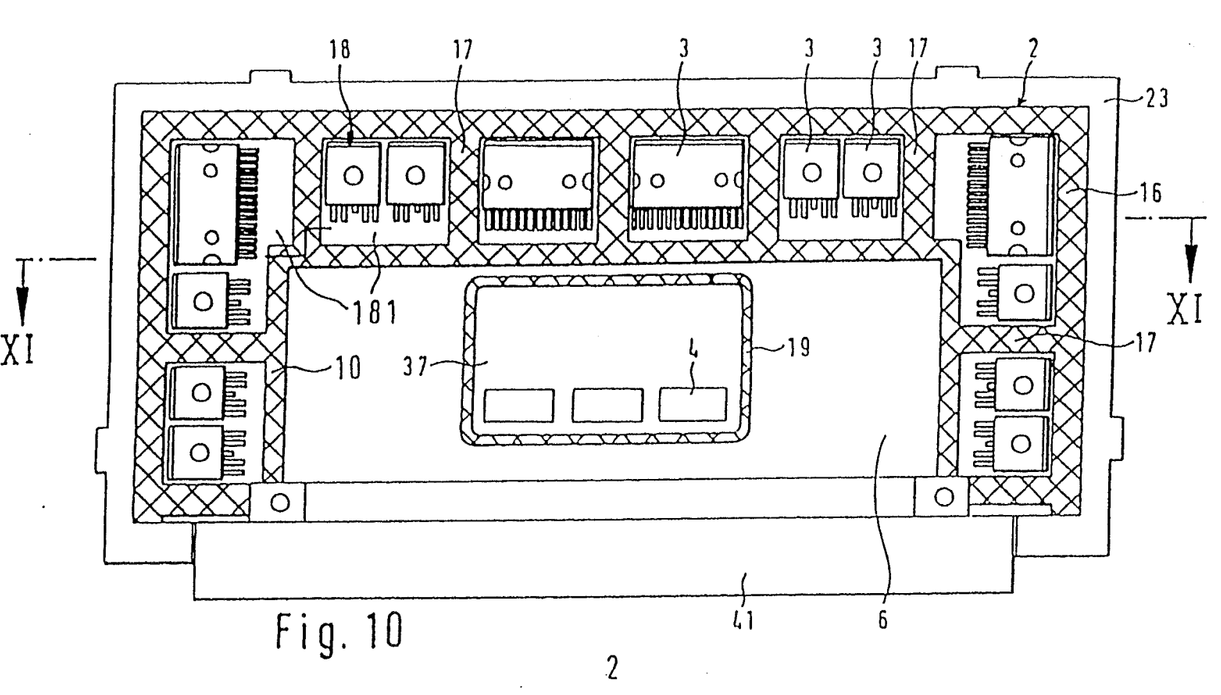
FIG. 10 shows a section parallel to the dividing plane of the housing parts of another embodiment example of a housing for control devices.
Figure 11:
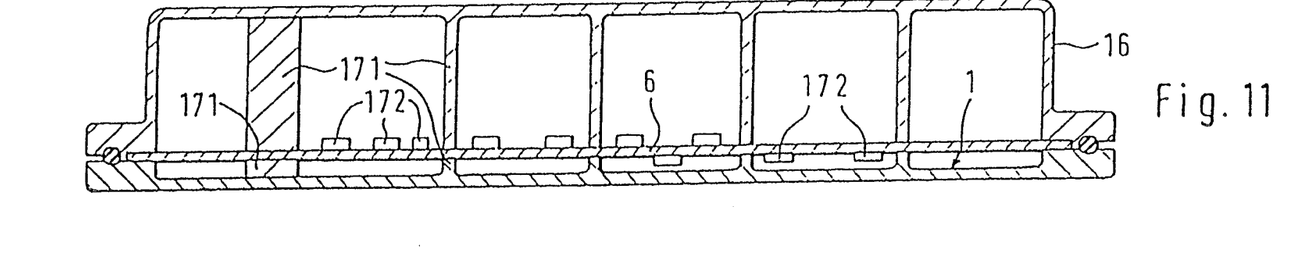
FIG. 11 shows a section along line XI—XI in FIG. 10 through the housing.

FIGS. 10 and 11 show a housing in which the printed circuit board 6 is clamped between the base 1 and the cover 2 as in the preceding embodiment examples. As in the preceding embodiment examples, power components 3 and control elements 4 are arranged on the upper side of the printed circuit board 6 Further, the lining 10 is provided on both sides of the printed circuit board in its edge area. In contrast to the embodiment examples described above, the lining 10 in the present embodiment example is constructed in such a way that individual power components 3 or power components which are combined in groups are enclosed in a parcel-like manner. Obviously, no lining 10 is applied in the region of the conductor paths on the printed circuit board 6. In these regions, the lining extends as far as the conductor paths without touching them. Cross pieces 171 extending roughly vertically to the surface of the printed circuit board are constructed in the base 1 and cover 2 and are connected with the peripheral walls 16 and the upper side of the cover 2 or with the underside of the base 1. These cross pieces 171 are constructed in such a way that they enclose or define the parcels 181 formed on the printed circuit board 6. The end faces of the cross pieces 171 lie on the printed circuit board 6 or on the lining 10. Recesses 172 which enclose the conductor paths at a distance therefrom are formed in the cross pieces 171 in the region of the conductor paths on the printed circuit board 6. When using SMD components, these conductor paths are formed on the upper side or underside of the printed circuit board. However, they can also extend on both sides of the printed circuit board, e.g. when components are arranged on both sides or when SMD components and components formed by wires are arranged on one side of the printed circuit board. The cross pieces 171 are formed in the base 1 and cover 2 in such a way that they are aligned with one another and contact the corresponding lining 10 on the upper side and underside of the printed circuit board 6, respectively. The cross pieces 171 are substantially oriented in such a way that they extend parallel to one of the peripheral walls 16. However, they can also be oriented in any other way. The stability of the housing with respect to vibrations is considerably improved by this parcel-like construction of the printed circuit board and by the correspondingly constructed cross pieces 171 which contact the printed circuit board 6. Moreover, individual power components 3 or groups of power components 3 and/or control elements 4 are accommodated in virtually closed chambers so that heat is guided off in an improved manner. This also locally confines or impedes and convection and accordingly influence on other components.

A housing having two parts or substantially two parts was shown in the preceding. Of course, such a housing can also be constructed from three or more parts with an intermediate part located between the cover and base, e.g. particularly when two printed circuit boards are to be connected with the housing in the manner described above.

Figure 3:
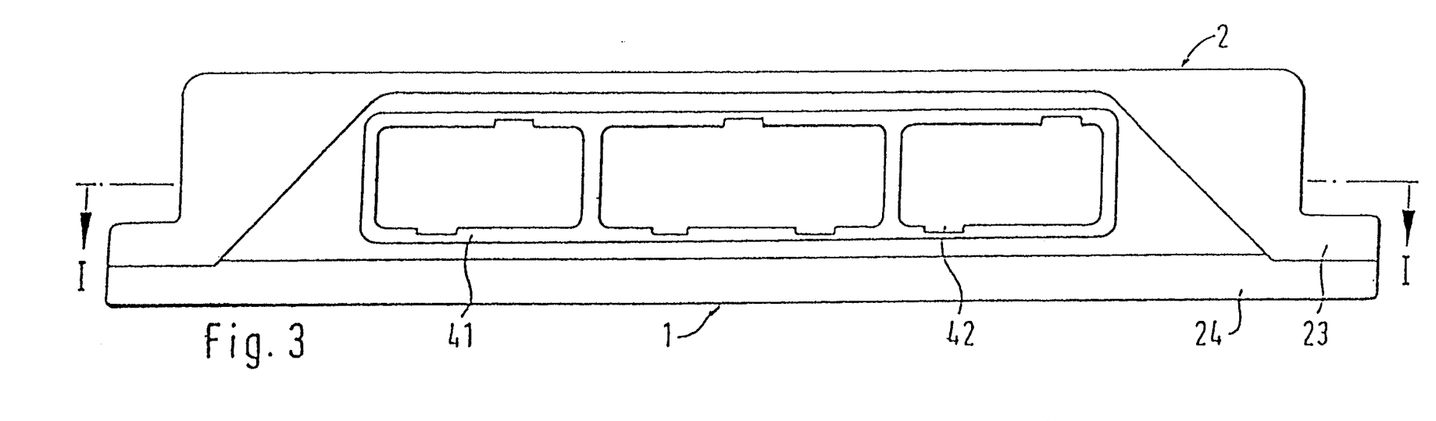
FIG. 3 shows a side view of the inventive control housing shown in FIG. 1 as seen from the electrical connection side.
Figure 4:
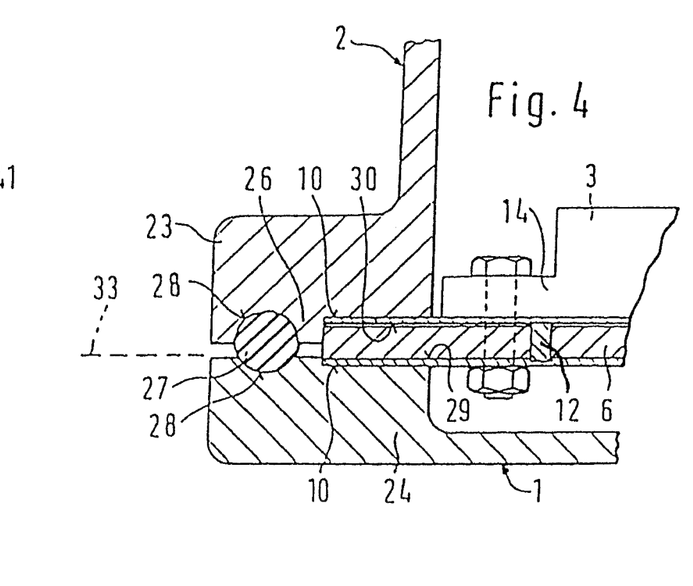
FIG. 4 shows an enlarged section from IV of FIG. 2.

FIG. 3 shows a view of the side from which the circuit makes contact. A three-part plug-in connection 41 which is coded with recesses 42 at the edge is shown here.

A shielding of sensitive electrical components against disruptive radiation and a good cooling of the power components without additional heat sinks is achieved in a very simple manner with the housing according to the invention.

It will be understood that each of the elements described above, or two or more together, may also find a useful application in other types of constructions differing from the types described above.

While the invention has been illustrated and described as embodied in a housing for control units, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A housing for control devices, comprising a plurality of housing parts including at least one base part and at least one cover part composed of electrically conducting and thermally conducting materials; at least one carrier member arranged inside said housing and carrying electrical power components and control elements; at least one plug element secured in said housing and connecting to said components electrically from outside, said carrier member being a printed circuit board which is clamped at at least one portion of its outer region between portions of said base part and said cover part, said printed circuit board having a lining of electrically conducting and thermally conducting material, said lining being clamped between said housing parts and extending to an adjoining region on said board and is connected with the components so as to promote thermal conduction therefrom, said housing parts having a dividing plane therebetween and a peripheral wall arranged substantially perpendicularly to said dividing plane, said housing parts having a flange region projecting inwardly from said peripheral wall, said flange region being at least partially peripheral and comprising an end face of one of said housing parts which contacts said printed circuit board and said lining and forms cross pieces with niches enclosing the components on said printed circuit board.

2. A housing as defined in claim 1, wherein said housing parts have cross pieces which define fields on said printed circuit board.

3. A housing as defined in claim 1, wherein said flange region is comprised of inwardly extending parts of said housing wall, said housing walls having other outwardly bent parts in an outer flange region in said one housing part, said printed circuit board with said lining being clamped between said outer flange region and another of said housing parts.

4. A housing for control devices, comprising a plurality of housing parts including at least one base part and at least one cover part composed of electrically conducting and thermally conducting materials; at least one carrier member arranged inside said housing and carrying electrical power components and control elements; at least one plug element secured in said housing and connecting to said components electrically from outside, said carrier member being a printed circuit board which is clamped at at least one portion of its outer region between portions of said base part and said cover part, said printed circuit board having a lining of electrically conducting and thermally conducting material, said lining being clamped between said housing parts and extending to an adjoining region on said board and is connected with the components so as to promote thermal conduction hereform, said housing parts having cross pieces provided with recesses at end faces which contact said printed circuit board for thermal conductor paths.

5. A housing as defined in claim 4, wherein said connecting pieces includes a region inside which the electrical components are located, said region protecting the electrical components from electrical and electromagnetic radiation and preventing them from radiating electrical or electromagnetic energy.

6. A housing for control devices, comprising a plurality of housing parts including at least one base part and at least one cover part composed of electrically conducting and thermally conducting materials; at least one carried member arranged inside said housing and carrying electrical power components and control elements; at least one plug element secured in said housing and connecting to said components electrically from outside, said carrier member being a printed circuit board which is clamped at at least one portion of its outer region between portions of said base part and said cover part, said printed circuit board having a lining of electrically conducting and thermally conducting material, said lining being clamped between said housing parts and extending to an adjoining region on said board and is connected with the components so as to promote thermal conduction therefrom.

7. A housing as defined in claim 6, wherein said housing parts each have a flange; and further comprising means securely connecting said housing parts in a region including said flanges.

8. A housing as defined in claim 7, wherein said connecting means is clamping means.

9. A housing as defined in claim 7, wherein said connecting means is screwing means.

10. A housing as defined in claim 6, wherein one of said housing parts has a flange having an edge which is raised in direction of another of said housing parts and encloses end sides of said printed circuit board and said another housing part so as to overlap them.

11. A housing as defined in claim 6, wherein said printed circuit board has two sides, said lining including lining portions provided on said two sides of said printed circuit board and conducting connection parts connecting said lining portions with one another and extending through said printed circuit board.

12. A housing as defined in claim 6, wherein said printed circuit board has a recess which accommodate said lining and has a depth corresponding to a height of said lining.

13. A housing as defined in claim 12, wherein said lining is a copper layer inside said recess.

14. A housing as defined in claim 11, wherein said printed circuit board has bore holes receiving and guiding said connection parts.

15. A housing as defined in claim 14, wherein said lining includes said bore holes and makes contact from one side to the other side of said printed circuit board through said bore holes.

16. A housing as defined in claim 6, wherein said lining is composed of copper.

17. A housing as defined in claim 6, wherein said printed circuit board has edges, said lining covers said edges of said printed circuit board circumferentially.

18. A housing as defined in claim 6; and further comprising cooling vanes connecting said components with said printed circuit board.

19. A housing as defined in claim 18, wherein said cooling vanes are soldered with said lining.

20. A housing as defined in claim 6, wherein said housing parts have a dividing plane and a peripheral wall extending perpendicularly to said dividing plane, said housing parts having cross pieces projecting from said peripheral wall so as to continue in an opposite one of said housing parts to be aligned and end in a plane of an end face of said housing parts, said printed circuit board being clamped between said cross pieces, said lining extending at least along a part of an end face of said cross pieces.

21. A housing as defined in claim 6, wherein said housing parts have a dividing plane therebetween and an outer wall extending parallel to said dividing plane, said housing parts having cross pieces projecting from said outer wall and continuing in an opposite one of said housing parts so as to align and end in a plane of an end face of said housing parts, said printed circuit board being clamped between said cross pieces, said lining extending at least along a part of an end face of said cross pieces.

22. A housing as defined in claim 6, wherein said housing parts have cross pieces which define fields on said printed circuit board.

23. A housing as defined in claim 21, wherein said housing parts have cross pieces which define fields on said printed circuit board.

24. A housing as defined in claim 6, wherein said housing parts have a peripheral wall and cross pieces with niches enclosing the components.

25. A housing as defined in claim 6; and further comprising connecting pieces having end faces and including one connecting piece projecting from a housing wall of one of said housing parts and another connecting piece projecting from a housing wall from another housing part and being aligned with said one connecting piece, said printed circuit board being clamped between said end faces of said connecting pieces.

26. A housing as defined in claim 25, wherein said printed circuit board has a location where it is clamped between said connecting pieces and is provided at said location at both sides with a through-contacted lining which is at least partially conductive.

27. A housing as defined in claim 26, wherein said through-contacted lining on both board sides extends to an outer periphery of said printed circuit board.

28. A housing as defined in claim 6; and further comprising means connecting said housing with a ground.

* * * * *